(12) United States Patent
Park et al.

(10) Patent No.: US 9,960,193 B2
(45) Date of Patent: May 1, 2018

(54) DISPLAY DRIVER INTEGRATED CIRCUIT AND METHOD OF MANUFACTURING THE SAME

(71) Applicant: SAMSUNG ELECTRONICS CO., LTD., Suwon-si (KR)

(72) Inventors: Jin-Woo Park, Seoul (KR); Siwoo Kim, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 8 days.

(21) Appl. No.: 15/136,075

(22) Filed: Apr. 22, 2016

(65) Prior Publication Data
US 2016/0315099 A1 Oct. 27, 2016

(30) Foreign Application Priority Data

Apr. 24, 2015 (KR) .......................... 10-2015-0058156

(51) Int. Cl.
*H01L 21/44* (2006.01)
*H01L 27/12* (2006.01)
*G03F 1/00* (2012.01)

(52) U.S. Cl.
CPC .............. *H01L 27/124* (2013.01); *G03F 1/00* (2013.01)

(58) Field of Classification Search
CPC .............. H04N 5/23293; H04N 5/2354; H04N 5/23219; H01L 27/124; H01L 27/1262
See application file for complete search history.

(56) References Cited

U.S. PATENT DOCUMENTS

| 5,888,676 | A | 3/1999 | Saitoh |
| 6,979,604 | B2 | 12/2005 | Tak et al. |
| 7,688,423 | B2 | 3/2010 | Bleeker et al. |
| 8,384,085 | B2 * | 2/2013 | Kimura ................. H01L 27/124 |
| | | | 257/350 |
| 8,852,830 | B2 | 10/2014 | Hirayama et al. |

FOREIGN PATENT DOCUMENTS

| JP | H 9-251954 A | 9/1997 |
| JP | 200693417 A | 4/2006 |
| JP | 2014229749 A | 12/2014 |
| KR | 20020001429 A | 1/2002 |
| KR | 100522028 B1 | 1/2006 |
| KR | 100713893 B1 | 5/2007 |

* cited by examiner

*Primary Examiner* — (Vikki) Hoa B Trinh
(74) *Attorney, Agent, or Firm* — Sughrue Mion, PLLC

(57) ABSTRACT

A display driver integrated circuit and a method of manufacturing the same are provided. The method of manufacturing a display driver integrated circuit (DDI) including a first area, a second area, and an overlapping area in which the first area and the second area overlap each other includes forming a first pattern in the first area using a first reticle; and forming a second pattern in the second area using a second reticle, and ends of the first pattern and the second pattern are connected within the overlapping area and the first area and the second area are asymmetrically set based on the overlapping area such that the overlapping area includes only a metal line.

20 Claims, 6 Drawing Sheets

DISPLAY DRIVER INTEGRATED CIRCUIT AND METHOD OF MANUFACTURING THE SAME

CROSS-REFERENCE TO RELATED APPLICATION

This application claims priority under 35 U.S.C. § 119 from Korean Patent Application No. 10-2015-0058156 filed on Apr. 24, 2015, the entire contents of which are incorporated herein by reference in their entirety.

BACKGROUND

1. Field

Apparatuses and methods consistent with exemplary embodiments relate to a display driver integrated circuit and a method of manufacturing the same, and more particularly, to a display driver integrated circuit manufactured by applying a stitch method and a method of manufacturing the same.

2. Description of Related Art

Because reticles have a size limit in a photolithography process, integrated circuits (ICs) according to a related art may be manufactured within the sizes of the reticles. However, when the ICs are bigger than the sizes of the reticles, a stitching technique which divides all layers in the ICs in half can be applied to the ICs.

As resolutions of display panels increase, the number of output pads in display driver integrated circuits (DDIs) may continuously increase. Accordingly, a DDI which supports an ultra-high density resolution (UHD) cannot be manufactured using one reticle.

SUMMARY

Exemplary embodiments provide a method of manufacturing a display driver integrated circuit (DDI) to which a stitch method is asymmetrically applied.

Other exemplary embodiments also provide a DDI.

The technical objectives are not limited to the above disclosure, and other objectives may become apparent to those of ordinary skill in the art based on the following descriptions.

According to an aspect of an exemplary embodiment, a method of manufacturing a display driver integrated circuit including a first area, a second area, and an overlapping area in which the first area and the second area overlap each other includes forming a first pattern in the first area using a first reticle and forming a second pattern in the second area using a second reticle, and ends of the first pattern and the second pattern are connected within the overlapping area and the first area and the second area are asymmetrically set based on the overlapping area such that the overlapping area includes only a metal line.

The first pattern may include a line portion which extends in one direction and an end portion, and a width of the end portion of the first pattern may be greater than a width of the line portion of the first pattern.

The second pattern may include a line portion which extends in one direction and an end portion, and a width of the end portion of the second pattern may be greater than a width of the line portion of the second pattern.

The end of the first pattern included in the overlapping area may be formed with a hammer pattern or a ball pattern.

The end of the second pattern included in the overlapping area may be formed with a hammer pattern or a ball pattern.

The DDI may include a symmetrical structure.

The DDI may include a driving logic circuit and an interface circuit, wherein the driving logic circuit and the interface circuit may be located in a center of the DDI, and the overlapping area may not include the driving logic circuit and the interface circuit.

The DDI may further include a graphic memory device for storing display data and a source driver and each of the first area and the second area may further include the graphic memory device and the source driver.

The overlapping area may not include a transistor.

According to an aspect of another exemplary embodiment, a DDI includes a first area formed using a first reticle; and a second area formed using a second reticle, and the first area and the second area shares an overlapping area, and the first area and the second area are asymmetrically set based on the overlapping area such that the overlapping area includes only a metal line.

A first pattern formed using the first reticle and a second pattern formed using the second reticle may be connected in the overlapping area.

The first pattern may include a line portion which extends in one direction and an end portion, and a width of the end portion of the first pattern may be greater than a width of the line portion of the first pattern, and the second pattern may include a line portion which extends in one direction and an end portion, and a width of the end portion of the second pattern may be greater than a width of the line portion of the second pattern.

Each end of the first pattern and the second pattern may be formed with a hammer pattern or a ball pattern.

The DDI may include a driving logic circuit and an interface circuit, wherein the driving logic circuit and the interface circuit may be located in a center of the DDI, and the overlapping area may not include the driving logic circuit and the interface circuit.

The DDI may be integrated with a display panel as a single package.

According to an aspect of another exemplary embodiment, a mobile device includes an application processor; a DDI configured to receive display data from the application processor; and a display panel configured to display the display data in response to a control of the DDI, and the DDI includes a first area formed using a first reticle; and a second area formed using a second reticle, and the first area and the second area shares an overlapping area and the first area and the second area are asymmetrically set based on the overlapping area such that the overlapping area includes only a metal line.

A first pattern formed using the first reticle and a second pattern formed using the second reticle may be connected in the overlapping area.

The first pattern may include a line portion which extends in one direction and an end portion, and a width of the end portion of the first pattern may be greater than a width of the line portion of the first pattern, and the second pattern may include a line portion which extends in one direction and an end portion, and a width of the end portion of the second pattern may be greater than a width of the line portion of the second pattern.

Each end of the first pattern and the second pattern may be formed with a hammer pattern or a ball pattern.

The DDI may be integrated with a display panel as a single package.

BRIEF DESCRIPTION OF THE DRAWINGS

The foregoing and other features and advantages of the exemplary embodiments will be apparent from the descriptions of exemplary embodiments, as illustrated in the accompanying drawings in which like reference characters refer to the same parts throughout the different views. The drawings are not necessarily to scale, emphasis instead being placed upon illustrating the principles of the exemplary embodiments. In the drawings.

DETAILED DESCRIPTION OF THE EXEMPLARY EMBODIMENTS

Figure 1:
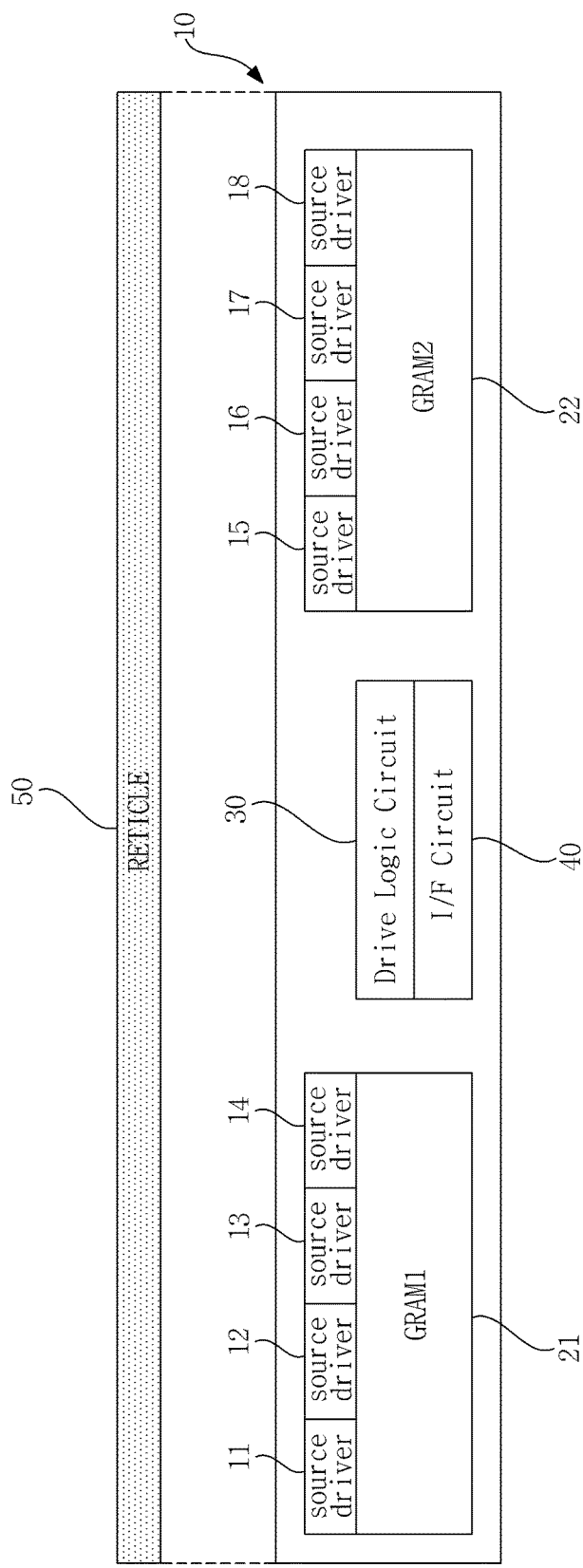
FIG. 1 is a block diagram illustrating a display driver integrated circuit (DDI)

Exemplary embodiments are described below in sufficient detail to enable those of ordinary skill in the art to embody and practice the inventive concept. It is important to understand that the exemplary embodiments may be embodied in many alternate forms and should not be construed as limited to the exemplary embodiments set forth herein.

While the exemplary embodiment may be subject to various modifications and alternative forms, specific exemplary embodiments thereof are shown by way of example in the drawings and will herein be described in detail. It should be understood, however, that the exemplary embodiments are not limited to the particular forms disclosed, and may include all modifications, equivalents, and alternatives falling within the spirit and scope of the inventive concept.

It will be understood that, although the terms "first," "second," "A," "B," etc. may be used herein in reference to elements of the exemplary embodiments, such elements should not be construed as being limited by these terms. For example, a first element could be termed a second element, and a second element could be termed a first element, without departing from the scope of the inventive concept. Herein, the term "and/or" includes any and all combinations of one or more referents.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe exemplary embodiments is not intended to limit the scope of the inventive concept. The articles "a," "an," and "the" are singular in that they have a single referent, however the use of the singular form in the present document should not preclude the presence of more than one referent. In other words, elements of the exemplary embodiments referred to as in singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which the exemplary embodiments belong. It will be further understood that terms in common usage should also be interpreted as is customary in the relevant art and not in an idealized or overly formal sense unless expressly so defined herein.

Meanwhile, when it is possible to implement an exemplary embodiment in any other way, a function or an operation specified in a specific block may be performed differently from a flow specified in a flowchart. For example, consecutive two blocks may actually perform the function or the operation simultaneously, and the two blocks may perform the function or the operation conversely according to a related operation or function.

Exemplary embodiments will be described below with reference to attached drawings.

FIG. 1 is a block diagram illustrating a display driver integrated circuit (DDI) according to a related art. Referring to FIG. 1, a DDI 10 may include a plurality of source drivers 11 to 18, a first and second graphic memories 21 and 22, a driver logic circuit 30, and an interface circuit 40.

The DDI 10 may receive image data from an application processor through the interface circuit 40. Each of the first and second graphic memories 21 and 22 may store the image data which is received from the application processor. The driver logic circuit 30 may control each of the source drivers 11 to 18 such that the source drivers 11 to 18 transmit the image data to the display device.

A size of a reticle 50 may be a slightly different depending on the type of equipment. Generally, the size of the reticle 50 may be slightly greater than about 30000 μm. Accordingly, when the length of a major axis of DDI 10 is greater than the size of the reticle 50, the method of manufacturing the DDI 10 may not perform a photolithography process using only the reticle 50.

For example, when the length of a major axis of an integrated circuit (IC) is within 30000 μm, the reticle 50 which is used in the photolithography process may be applied to the IC. Accordingly, the method of manufacturing the DDI 10 may be performed by the photolithography process using only the reticle 50.

However, when the DDI 10 supports an ultra-high density (UHD) resolution (i.e., a resolution of 3840×2160), the length of a major axis of the DDI 10 may be greater than 30000 μm. Here, the DDI 10 may not be manufactured using only the reticle 50.

Further, owing to a pad pitch, the DDI 10 may have a limit to reduce a chip size.

To overcome the above problem, a method of manufacturing a DDI according to an exemplary embodiment may include a stitching method in an exposure process. The stitching method will be described with reference to FIG. 2 in detail.

Figure 2:
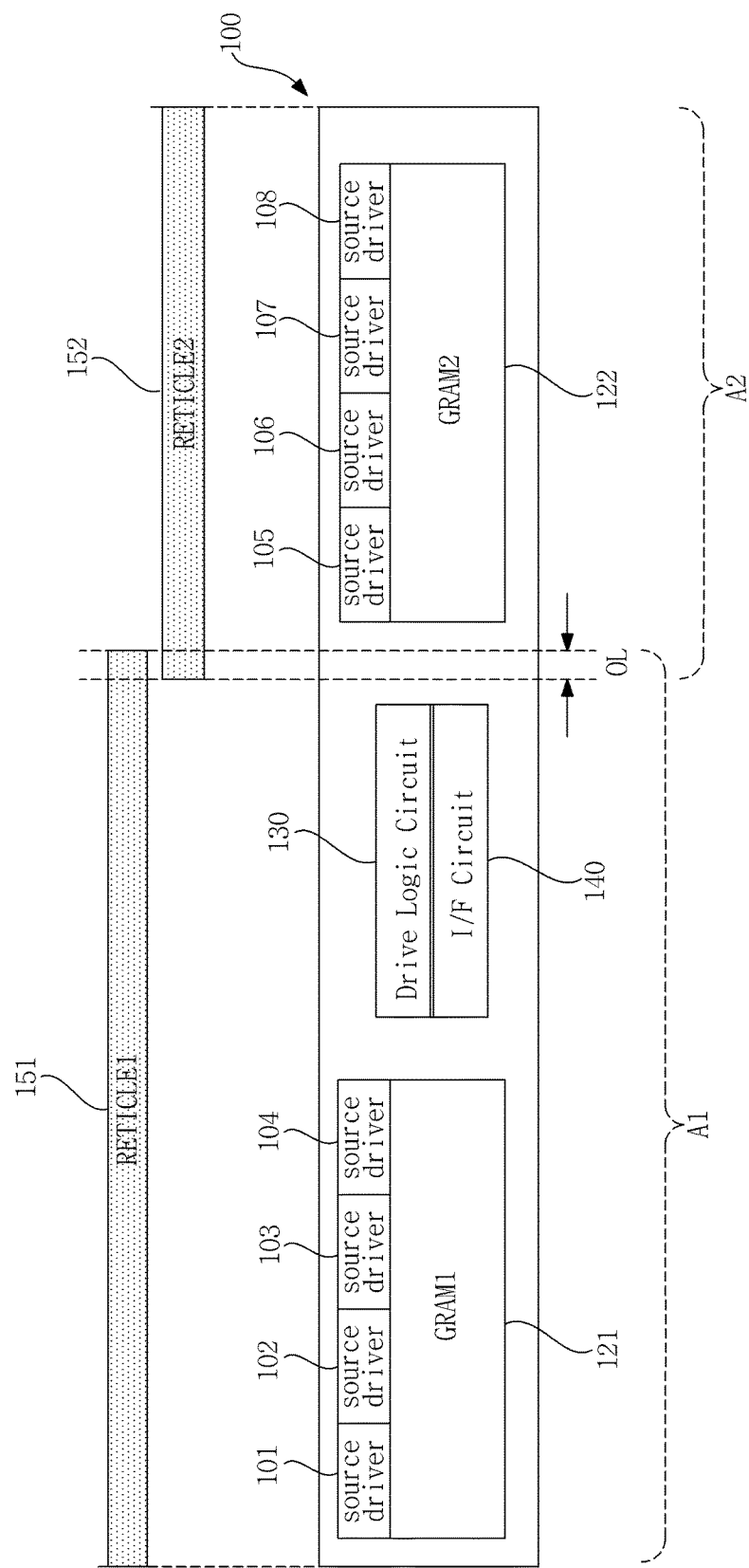
FIG. 2 is a block diagram illustrating a DDI according to an exemplary embodiment.

FIG. 2 is a block diagram illustrating a DDI according to an exemplary embodiment. Referring to FIG. 2, a DDI 100 according to an exemplary embodiment may include a plurality of source drivers 101 to 108, a first and second graphic memories 121 and 122, a driving logic circuit 130, and an interface circuit 140.

When a length of a major axis of the DDI 100 is greater than 30000 μm, the DDI 100 may be manufactured using the stitching method.

The first reticle 151 and the second reticle 152 may be installed in a stepper which is process equipment used in a photolithography process. For example, the stepper may form a first pattern in a first area A1 using the first reticle 151. Moreover, the stepper may form a second pattern in a second area A2 using the second reticle 152.

The first pattern and the second pattern may be combined in an overlapping area OL. That is, the overlapping area OL is an area in which the first pattern and the second pattern overlap each other. To improve contact characteristics between the first pattern and the second pattern, each end of the first pattern and the second pattern may be formed with a hammer pattern or a ball pattern. Accordingly, a combination between the first pattern and the second pattern in the overlapping area OL may have a stable characteristic. The first pattern and the second pattern will be described with reference to FIGS. 3A and 3B in detail.

The DDI 100 may include a symmetrical structure. Accordingly, a central area of the DDI 100 may include a driving logic circuit 130 and an interface circuit 140.

When the stitching method is applied symmetrically to the DDI 100, the overlapping area OL may be a central area of the DDI 100. Here, the overlapping area OL may include a part of the driving logic circuit 130 or a part of the interface circuit 140.

The driving logic circuit 130 and the interface circuit 140 are important blocks in the DDI 100. Accordingly, when the overlapping area OL includes a part of the driving logic circuit 130 or a part of the interface circuit 140, the DDI may be abnormally operated.

To overcome the above problem, the first area A1 and the second area A2 may be asymmetrically set in a layout of the DDI 100 according to an exemplary embodiment. That is, the overlapping area OL may be set such that main circuits of the DDI 100 are not included. For example, the overlapping area OL may not include a transistor but include a metal line. In an exemplary embodiment, a width of the overlapping area OL may be about 3 μm.

In an exemplary embodiment, the first area A1 may include a plurality of source drivers 101 to 104, a first graphic memory (GRAM1) 121, and a driving logic circuit 130, and an interface circuit 140. Moreover, the second area A2 may include a plurality of source drivers 105 to 108 and a second graphic memory (GRAM2) 122.

In an exemplary embodiment, the DDI 100 may be packaged together with a display panel. For example, the DDI 100 may be packaged on a film. Furthermore, the DDI 100 may be packaged on a glass panel.

The method of manufacturing the DDI 100 according to the exemplary embodiment will be described with reference to FIG. 5 in detail.

Further, the method of manufacturing the DDI 100 according to an exemplary embodiment may be applied to an integrated circuit which has a thin and long shape. For example, because a chip size of the image sensor increases as the number of pixels increase, the method of manufacturing the DDI 100 according to the exemplary embodiment may be applied to an image sensor.

Figure 3A:
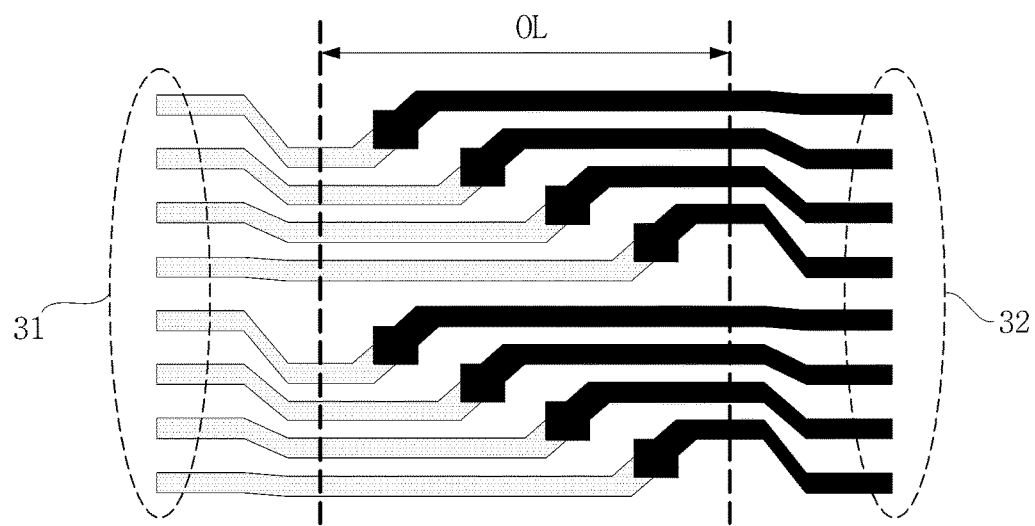
FIG. 3A is a layout illustrating the overlapping area shown in FIG. 2 in detail.

FIG. 3A is a layout illustrating the overlapping area shown in FIG. 2 in detail. Referring to FIGS. 2 and 3A, the first reticle 151 and the second reticle 152 may be installed in a stepper which is used in a photolithography process. For example, the stepper may form the first pattern 31 in the first area A1 using the first reticle 151. Moreover, the stepper may form the second pattern 32 in the second area A2 using the second reticle 152.

The first pattern 31 and the second pattern 32 may be combined in the overlapping area OL. To improve contact characteristics between the first pattern 31 and the second pattern 32, each end of the first pattern 31 and the second pattern 32 may be formed with a hammer pattern.

Figure 3B:
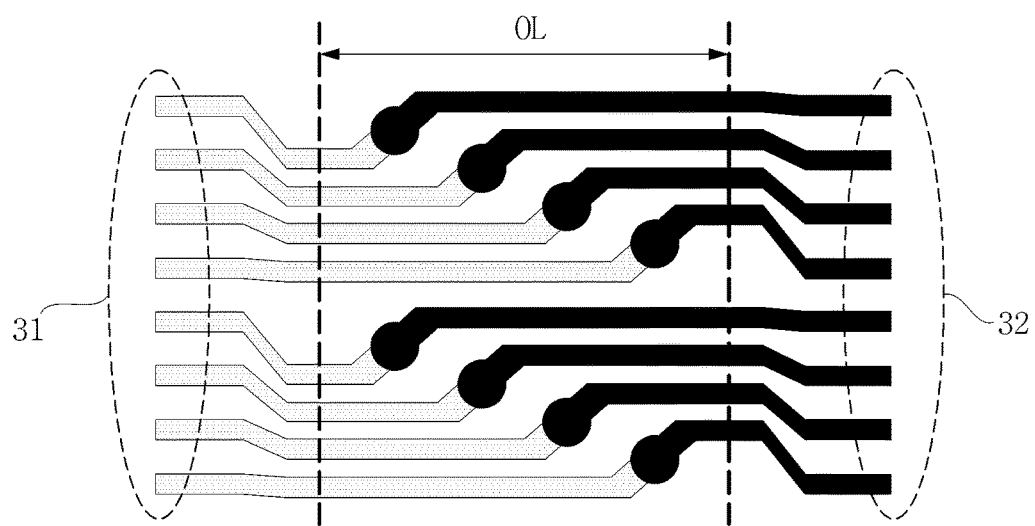
FIG. 3B is another layout illustrating the overlapping area shown in FIG. 2 in detail.

FIG. 3B is another layout illustrating the overlapping area shown in FIG. 2 in detail. Referring to FIGS. 2 and 3B, the first reticle 151 and the second reticle 152 may be installed in a stepper which is used in a photolithography process. For example, the stepper may form the first pattern 31 in the first area A1 using the first reticle 151. Moreover, the stepper may form the second pattern 32 in the second area A2 using the second reticle 152.

The first pattern 31 and the second pattern 32 may be combined in the overlapping area OL. To improve contact characteristics between the first pattern 31 and the second pattern 32, each end of the first pattern 31 and the second pattern 32 may be formed with a ball pattern.

Figure 4A:
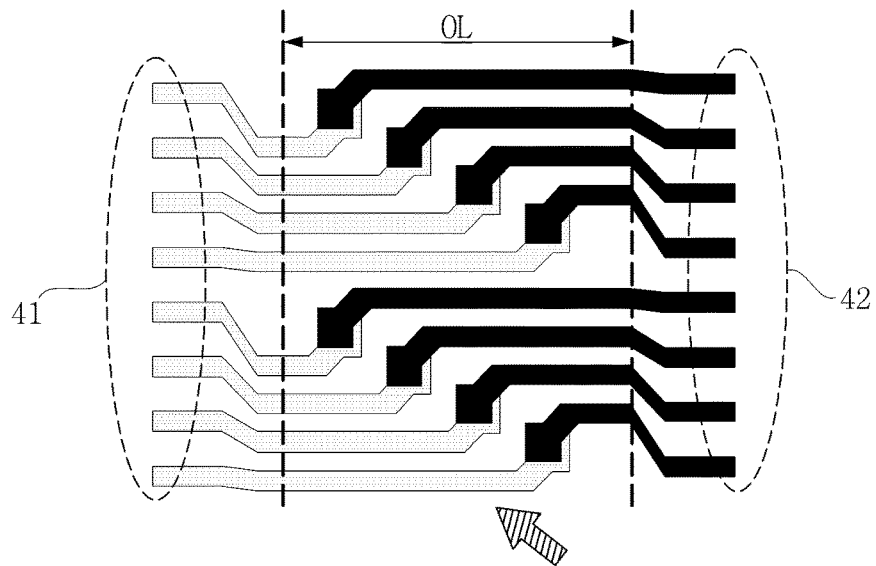
FIGS. 4A and 4B are layouts illustrating a combination of the first pattern and the second pattern in the overlapping area shown in FIG. 2.
Figure 4B:
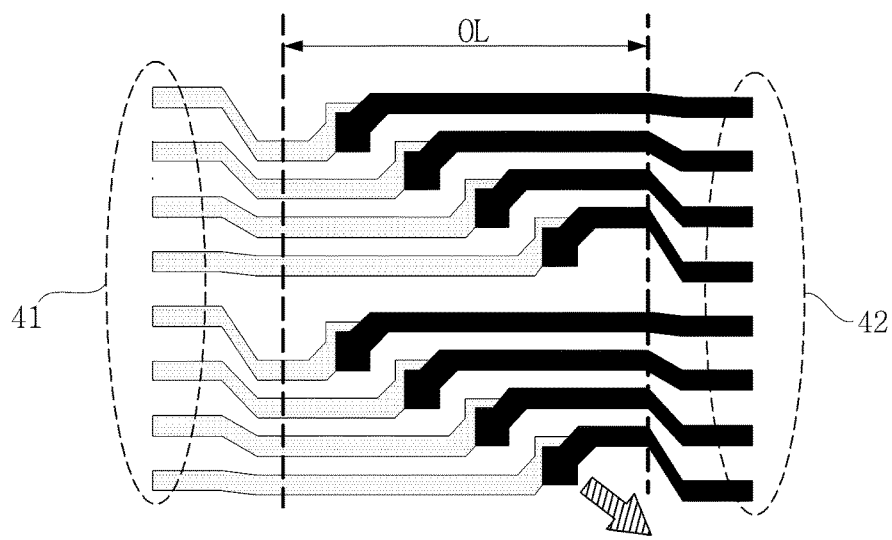

FIGS. 4A and 4B are layouts illustrating a combination of the first pattern and the second pattern in the overlapping area shown in FIG. 2. Referring to FIGS. 2 and 4A, a method of manufacturing the DDI 100 according to the exemplary embodiment may include performing a photolithography process twice using the first reticle 151 and the second reticle 152. The first pattern 41 formed using the first reticle 151 and the second pattern 42 formed using the second reticle 152 are combined in the overlapping area OL.

Here, misalignment may occur between the first pattern 41 and the second pattern 42. That is, the misalignment in which the first pattern 41 is located at a lower level than the second pattern 42 may occur. However, when each end of the first pattern 41 and the second pattern 42 is formed with a hammer pattern, the first pattern 41 and the second pattern 42 may be securely combined.

Referring to FIGS. 2 and 4B, the first pattern 41 formed using the first reticle 151 and the second pattern 42 formed using the second reticle 152 are combined in the overlapping area OL.

Here, misalignment may occur between the first pattern 41 and the second pattern 42. That is, the misalignment where the first pattern 41 is located at an upper level than the second pattern 42 may occur. However, when each end of the first pattern 41 and the second pattern 42 is formed with a hammer pattern, the first pattern 41 and the second pattern 42 may be securely combined.

Figure 5:
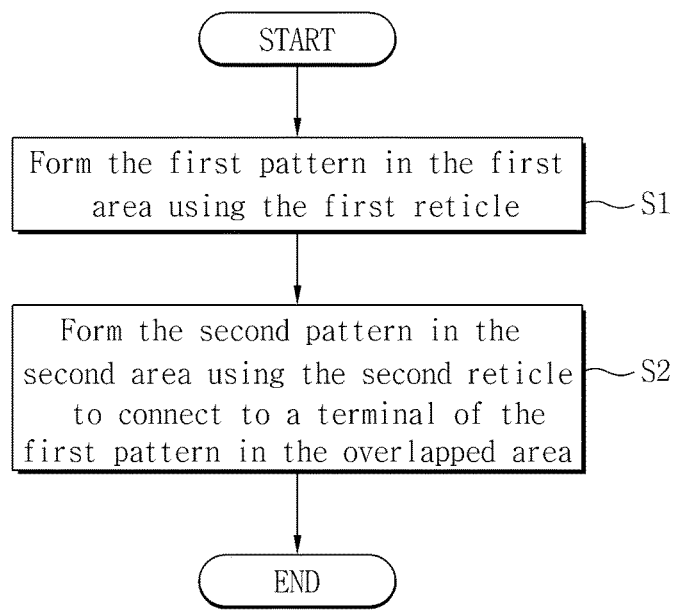
FIG. 5 is a flowchart illustrating a method of manufacturing the DDI shown in FIG. 2.

FIG. 5 is a flowchart illustrating a method of manufacturing the DDI shown in FIG. 2. Referring to FIGS. 2, 3, and 5, in operation S1, a method of manufacturing the DDI 100 may form the first pattern 31 using the first reticle 151 in the first area A1.

Further, in operation S2, the method of manufacturing the DDI 100 may form the second pattern 32 using the second reticle 152 in the second area A2. An end of the second pattern 32 is connected to an end of the first pattern 31 within the overlapping area OL. In an exemplary embodiment, the overlapping area OL may not include a transistor but include a metal line.

The first pattern 31 may include a line portion which extends in one direction and an end portion, and a width of the end portion of the first pattern 31 may be greater than a width of the line portion of the first pattern 31.

The second pattern 32 may include a line portion which extends in one direction and an end portion, and a width of the end portion of the second pattern 32 may be greater than a width of the line portion of the second pattern 32.

The end of the first pattern 31 included in the overlapping area OL may be formed with a hammer pattern or a ball pattern. Moreover, the end of the second pattern 32 included in the overlapping area OL may be formed with a hammer pattern or a ball pattern.

In an exemplary embodiment, the DDI 100 may have a symmetrical structure. For example, the driving logic circuit 130 and the interface circuit 140 are located in a center area of the DDI 100. Further, the first area A1 and the second area A2 may be asymmetrically formed.

Figure 6:
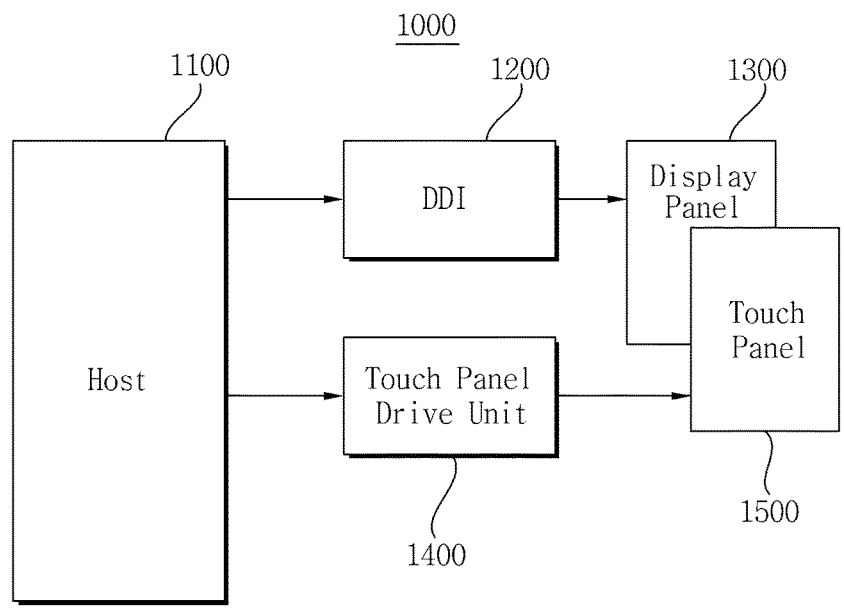
FIG. 6 is a block diagram illustrating a user system to which the DDI according to an exemplary embodiment is applied.

FIG. 6 is a block diagram exemplarily illustrating a user system to which the DDI according to the exemplary embodiment is applied. Referring to FIG. 6, the user system 1000 may include a host 1100, a DDI 1200, a display panel 1300, a touch panel drive unit 1400 (e.g., a touch panel driver, etc.), and a touch panel 1500.

The host 1100 may receive data or a command from a user and control the DDI 1200 and the touch panel drive unit 1400 based on the data or the command. The DDI 1200 may drive the display panel 1300 according to control of the host 1100. In an exemplary embodiment, the DDI 1200 may include the DDI 100 shown in FIG. 2.

The touch panel 1500 may be provided to overlap the display panel 1300. The touch panel drive unit 1400 may receive data sensed from the touch panel 1500 and transmit the sensed data to the host 1100.

Figure 7:
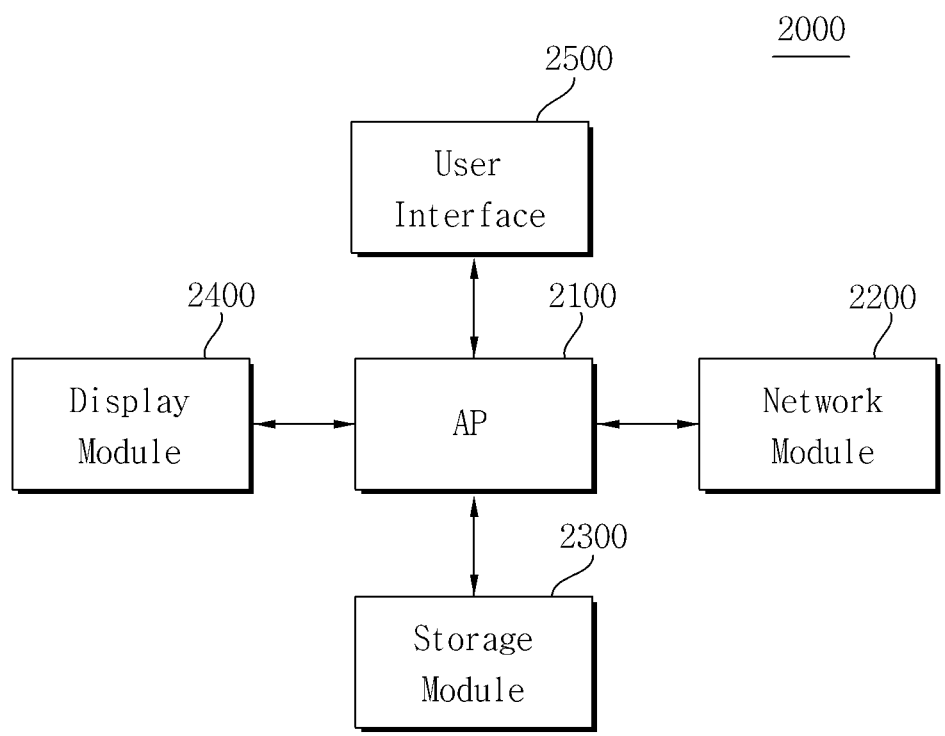
FIG. 7 is a block diagram illustrating a mobile system to which the DDI according to an exemplary embodiment of the inventive concept is applied.

FIG. 7 is a block diagram exemplarily illustrating a mobile system to which the DDI according to an exemplary embodiment of the inventive concept is applied. Referring to FIG. 7, the mobile system 2000 may include an application processor (AP) 2100, a network module 2200, a storage module 2300, a display module 2400, and a user interface 2500.

For example, the mobile system 2000 may be provided with one of computing systems such as an ultra mobile PC (UMPC), a work-station, a net-book, a personal digital assistant (PDA), a portable computer, a web tablet, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, and a digital video player.

The AP 2100 may operate components which are included in the mobile system 2000, an operating system (OS), etc. For example, the AP 2100 may include a graphic engine, controllers which control the components included in the mobile system 2000, and interfaces.

The network module 2200 may communicate with external devices. The network module 2200 may support a wireless communication such as a code division multiple access (CDMA), a global system for mobile communication (GSM), a wideband code division multiple access (WCDMA), a CDMA-2000, a time division multiple access (TDMA), a long term evolution (LTE), a WiMAX, a wireless local area network (WLAN), an ultra wide band (UWB), a Bluetooth, a wireless display (WI-DI), etc.

The storage module 2300 may store data. For example, the storage module 2300 may store data received from an external device. Moreover, the storage module 2300 may transmit the data stored in the storage module 2300 to the AP 2100. In an exemplary embodiment, the storage module 2300 may include a dynamic random access memory (DRAM), a synchronous DRAM (SDRAM), a static RAM (SRAM), a double date rate SDRAM (DDR SDRAM), a DDR2 SDRAM, a DDR3 SDRAM, a phase-change RAM (PRAM), a magnetic RAM (MRAM), a resistive RAM (RRAM), a NAND flash memory, and a NOR flash memory.

The display module 2400 may output image data according to control of the AP 2100. For example, the display module 2400 and the AP 2100 may communicate based on a display serial interface (DSI). In an exemplary embodiment, the display module 2400 may include the DDI 100 shown in FIG. 2.

The user interface 2500 may supply an interface, which inputs data or a command to the mobile system 2000 or outputs results based on the input data or the input command. In an exemplary embodiment, the user interface 2500 may include input devices, such as a camera device, a touch screen, a motion perceive module, and a microphone, and output devices such as a speaker, and a display panel.

A method of manufacturing the DDI according to an exemplary embodiment can asymmetrically apply a stitching method. Moreover, the method of manufacturing the DDI can improve contact characteristics according to the stitching method.

Exemplary embodiments may be applied to a DDI and a mobile apparatus having the same.

While the inventive concept has been described with reference to exemplary embodiments, it will be understood by those skilled in the art that various changes and modifications may be made without departing from the spirit and scope of the inventive concept as defined by the appended claims.

The foregoing is illustrative of exemplary embodiments and is not to be construed as limiting thereof. Although a few exemplary embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A method of manufacturing a display driver integrated circuit (DDI) including a first area, a second area, and an overlapping area in which the first area and the second area overlap each other, comprising:
   forming a first pattern in the first area by performing a first photolithography using a first reticle; and
   forming a second pattern in the second area by performing a second photolithography separate from the first photolithography, using a second reticle,
   wherein an end of the first pattern and an end of the second pattern are connected within the overlapping area, and
   wherein a position of the first pattern in the first area and a position of the second pattern in the second area are asymmetrical to each other with respect to the overlapping area, and the overlapping area includes only a metal line.

2. The method of claim 1, wherein the first pattern includes a line portion which extends in a first direction and an end portion, and
   wherein a width of the end portion of the first pattern is greater than a width of the line portion of the first pattern.

3. The method of claim 2, wherein the second pattern includes a line portion which extends in a second direction and an end portion, and wherein a width of the end portion of the second pattern is greater than a width of the line portion of the second pattern.

4. The method of claim 3, wherein the end of the first pattern included in the overlapping area comprises a hammer pattern or a ball pattern.

5. The method of claim 4, wherein the end of the second pattern included in the overlapping area comprises the hammer pattern or the ball pattern.

6. The method of claim 1, wherein the DDI comprises a symmetrical structure.

7. The method of claim 6, wherein the DDI comprises a driving logic circuit and an interface circuit,
wherein the driving logic circuit and the interface circuit are located in a center of the DDI, and
wherein the overlapping area excludes the driving logic circuit and the interface circuit.

8. The method of claim 6, wherein the DDI further comprises a graphic memory device configured to store display data and a source driver, and
wherein each of the first area and the second area further comprises the graphic memory device and the source driver.

9. The method of claim 1, wherein the overlapping area does not include a transistor.

10. A DDI, comprising:
a first area formed by performing a first photolithography using a first reticle; and
a second area formed by performing a second photolithography separate from the first photolithography, using a second reticle,
wherein the first area and the second area share an overlapping area, and
wherein the first area and the second area are asymmetrical to each other with respect to the overlapping area, and the overlapping area includes only a metal line.

11. The DDI of claim 10, wherein a first pattern formed using the first reticle and a second pattern formed using the second reticle are connected in the overlapping area.

12. The DDI of claim 11, wherein the first pattern comprises a line portion which extends in a first direction and an end portion, and a width of the end portion of the first pattern is greater than a width of the line portion of the first pattern, and
the second pattern includes a line portion which extends in a second direction and an end portion, and a width of the end portion of the second pattern is greater than a width of the line portion of the second pattern.

13. The DDI of claim 11, wherein each end of the first pattern and the second pattern comprises a hammer pattern or a ball pattern.

14. The DDI of claim 10, wherein the DDI includes a driving logic circuit and an interface circuit,
wherein the driving logic circuit and the interface circuit are located in a center of the DDI, and the overlapping area excludes the driving logic circuit and the interface circuit.

15. The DDI of claim 10, wherein the DDI is integrated with a display panel as a single package.

16. A method of manufacturing a display driver integrated circuit (DDI), the method comprising:
forming a first pattern by performing a first photolithography using a first reticle; and
forming a second pattern by performing a second photolithography separate from the first photolithography using a second reticle such that an end of the first pattern and an end of the second pattern are connected in an overlapping area,
wherein a position of the first pattern and a position of the second pattern are asymmetrical to each other with respect to the overlapping area, and the overlapping area includes only a metal line.

17. The method of claim 16, wherein the first pattern includes a line portion which extends in a first direction and an end portion, and
wherein a width of the end portion of the first pattern is greater than a width of the line portion of the first pattern.

18. The method of claim 16, wherein the second pattern includes a line portion which extends in a second direction and an end portion, and
wherein a width of the end portion of the second pattern is greater than a width of the line portion of the second pattern.

19. The method of claim 16, wherein the end of the first pattern included in the overlapping area comprises a hammer pattern or a ball pattern.

20. The method of claim 16, wherein the end of the second pattern included in the overlapping area comprises a hammer pattern or a ball pattern.

* * * * *